(12) United States Patent
Shiozaki

(10) Patent No.: US 7,526,008 B2
(45) Date of Patent: Apr. 28, 2009

(54) SURFACE EMITTING LASER DIODE

(75) Inventor: Masaki Shiozaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/746,160

(22) Filed: May 9, 2007

(65) Prior Publication Data
US 2007/0248125 A1 Oct. 25, 2007

(30) Foreign Application Priority Data
Oct. 22, 2004 (JP) ............................. 2004-307629

(51) Int. Cl.
*H01S 5/00* (2006.01)
(52) U.S. Cl. ............... 372/43.01; 372/45.01; 372/46.01
(58) Field of Classification Search ............. 372/43.01, 372/45.01, 46.01
See application file for complete search history.

(56) References Cited

U.S. PATENT DOCUMENTS 5,654,228 A * 8/1997 Shieh et al. .................... 438/32
5,778,018 A   7/1998 Yoshikawa et al.
6,639,931 B1  10/2003 Dowd et al.
2002/0009258 A1* 1/2002 Coldren et al. ................ 385/24
2004/0120376 A1* 6/2004 Kwak ........................ 372/45

* cited by examiner

*Primary Examiner*—Dung T Nguyen
(74) *Attorney, Agent, or Firm*—Sonnenschein Nath & Rosenthal LLP

(57) ABSTRACT

A surface emitting semiconductor laser device which can be manufactured easily and inexpensively and in which the direction of polarization of a laser beam can be controlled into a fixed direction. An oxidizing treatment is applied to a current confinement layer to form a current passage region in a rectangular shape having an in-plane anisotropy. In addition, a pair of trenches with their side surfaces, on the side of a beam outgoing aperture, set to be parallel to either of the diagonal direction of the current passage region is provided at opposite positions with the beam outgoing aperture as a center therebetween. The direction of polarization of the laser beam made to go out through the beam outgoing aperture is specified into only one direction, whereby the direction of polarization can be accurately controlled to a fixed direction. Besides, where the trench or trenches are filled with a metallic material or insulating material which is absorptive with respect to the laser beam, the polarization ratio of the laser beam is further enhanced.

12 Claims, 14 Drawing Sheets

SURFACE EMITTING LASER DIODE

BACKGROUND OF THE INVENTION

1. Field of the Invention

The present invention relates to a surface emitting semiconductor laser device which emits a laser beam in a vertical direction by a resonator extending in the vertical direction.

2. Description of the Related Art

In general, an end face emitting semiconductor laser device has a large difference in gain between the vertical direction and the horizontal direction with respect to an epitaxial layer in a light wave-guiding channel, and therefore has stable polarization characteristics. On the other hand, a surface emitting semiconductor laser device called VSSEL (Vertical Cavity Surface Emitting Laser), as for example shown in FIG. 17, has a resonator 97 set in the vertical direction relative to a substrate 91, and a current injected through a p-type electrode 95 and an n-type electrode 96 causes an active layer 93 to emit light. The light is amplified by semiconductor multilayer reflective layers having a reflectance of approximately 100% which are called DBR (Distributed Bragg Reflector) mirrors (a lower DBR layer 92 and an upper DBR layer 93), and a laser beam L9 is made to go out through a beam outgoing aperture 98. The surface emitting semiconductor laser device 9 with such a configuration does not have any anisotropy in gain in the plane vertical to the outgoing direction of the laser beam L9. In its polarization characteristics, therefore, the surface emitting semiconductor laser device 9 has an ununiformity in that dispersion of the direction of polarization would be generated due to dispersion of the device, and an instability in that the direction of polarization would be easily varied depending on output and ambient temperature.

Therefore, in the case of applying such a surface emitting semiconductor laser device to a polarization-dependent optical device such as mirror and beam splitter, i.e., in the case where the surface emitting semiconductor laser device is used, for example, as a light source in a digital copying machine or printer, the dispersion of the direction of polarization would generate differences in the image forming position or in the output, leading to blurring or irregularities in color.

In view of this, there have been proposed several technologies for stabilizing the polarization direction into one direction by providing a polarization controlling function in the inside of a surface emitting semiconductor laser device.

In one example of such technologies, use is made of a special inclined substrate having the (311) plane oriented in the normal and including gallium-arsenic (GaAs). Where a surface emitting semiconductor laser device is fabricated by use of such a special inclined substrate, the gain characteristic with respect to the [-2 33] direction is enhanced, and the polarization direction of the laser beam can be controlled to this direction. In addition, the polarization ratio of the laser beam is very high. Thus, this technology is effective in controlling the polarization in a surface emitting semiconductor laser device.

In another example of the above-mentioned technologies, a resonator oriented in the vertical direction is so shaped as to have an in-plane anisotropy, thereby controlling the direction of polarization of a laser beam. For example, Japanese Patent No. 2891133 discloses a technology in which the post shape of a resonator is reduced into such a region that light undergoes a diffraction loss and is made to be rectangular (with a minor side of not more than 5 μm and a major side of 6 μm), whereby the polarization direction is controlled to the longitudinal direction in which the diffraction loss is smaller. Where the post shape of the resonator is configured in this manner, the direction of polarization of the laser beam can be set to an arbitrary direction by forming the minor side and the major side in arbitrary orientations.

Furthermore, JP-A-2001-525995 discloses a technology in which a discontinuity part is formed at a part of a metallic contact layer such as not to influence the characteristics of the laser beam made to go out through a beam outgoing aperture, to thereby obtain a polarized beam in a direction parallel to the boundary of the discontinuity part.

SUMMARY OF THE INVENTION

However, the inclined substrate with the (311) plane oriented in the normal is a special substrate, and is therefore very expensive as compared, for example, with the (001) plane substrate which is a standard substrate. In addition, where such a special inclined substrate is used, the epitaxial growth conditions such as growth temperature, doping conditions and gas flow rates are quite different from those in the case of the standard (001) plane substrate, so that it is difficult to manufacture the device.

In addition, the technology disclosed in Japanese Patent No. 2891133 has the problem that it is requisite to process the post shape in a size reduced down into such a region that light undergoes a diffraction loss and, therefore, the resistance of the resonator would be high. Besides, according to this technology, the output of the laser beam is as low as about 1 mW, which value is not practical for use as a light source in a digital copying machine or printer. In addition, in a configuration wherein the laser beam is made to go out on the substrate side, for restraining the absorption of the laser beam by the GaAs substrate, it may be necessary to etch off the GaAs substrate to a position proximate to the DBR layer, leading to a complicated manufacturing process. Further, since the post-shaped resonator is small, the resonator may be easily broken in the manufacturing process, so that stable manufacture is difficult to achieve.

WO2001/525995 describes an embodiment in which a groove (discontinuity part) with a depth of 4.0 to 4.5 μm was formed at a position spaced by 7 μm from an edge part of a beam outgoing aperture, whereby a polarized beam in a direction parallel to the groove was obtained. However, as described in Japanese Patent No. 2891133, a polarization controlling effect may not be obtained unless the minor side spacing of the resonance region is reduced to such an extent that a diffraction loss effect is generated. It is considered, therefore, that a boundary effect for controlling the polarization may not be obtained with a discontinuity part formed in such a range (the minor side spacing: 7 μm) that a diffraction loss effect is not obtained. In addition, if the polarization control is attributed to the effect of the stress or strain arising from the groove formation as described in this reference, it is considered that they may be influences of stresses due to other factors exerted on the device during the crystal growing or forming steps.

Thus, according to the technologies of the related art, it has been difficult to manufacture easily and inexpensively a surface emitting semiconductor laser device in which the direction of polarization of a laser beam can be controlled to a fixed direction, the resistance of a resonator can be lowered, and an enhanced laser beam output can be obtained.

Accordingly, there is a need for a surface emitting semiconductor laser device which can be manufactured easily and inexpensively and in which the direction of polarization of a laser beam can be controlled to a fixed direction.

According to one embodiment of the present invention, there is provided a first surface emitting semiconductor laser device including a first semiconductor multilayer reflective film formed over a substrate, an intermediate layer formed over the first semiconductor multilayer reflective film and having an active layer and a current confinement layer, and a second semiconductor multilayer reflective film formed over the intermediate layer and provided with a beam outgoing aperture, a part of the first semiconductor multilayer reflective film, the intermediate layer and the second semiconductor multilayer reflective film forming a solid cylindrical resonance part, wherein the current confinement layer has a current passage region having a rectangular shape with an in-plane anisotropy, and the second semiconductor multilayer reflective film has a pair of trenches which are opposed to each other with the beam outgoing aperture as a center therebetween and side surfaces of which on the beam outgoing aperture side are parallel to either of the diagonal directions of the current passage region. In this case, the substrate is preferably a (100) plane substrate or a (n11) plane substrate (n: integer). In addition, the current passage region is preferably formed by applying an oxidizing treatment to a current confinement layer includes aluminum-arsenic (AlAs), and the side surfaces, on the beam outgoing aperture side, of the pair of trenches are set in the [01 −1] direction or the [011] direction.

According to another embodiment of the present invention, there is provided a second surface emitting semiconductor laser device including a first semiconductor multilayer reflective film formed over a substrate, an intermediate layer formed over the first semiconductor multilayer reflective film and having an active layer and a current confinement layer, and a second semiconductor multilayer reflective film formed over the intermediate layer and provided with a beam outgoing aperture, a part of the first semiconductor multilayer reflective film, the intermediate layer and the second semiconductor multilayer reflective film forming a columnar resonance part with a rectangular or elliptic cross section, wherein the current confinement layer has a current passage region having a rectangular or elliptic shape according to the shape of the resonance part, and the second semiconductor multilayer reflective film has a pair of trenches which are opposed to each other with said beam outgoing aperture as a center therebetween and side surfaces of which on the beam outgoing aperture side are parallel to the longitudinal direction of the current passage region.

In the first surface emitting semiconductor laser device according to the one embodiment of the present invention, the current passage region is formed in the rectangular shape with an in-plane anisotropy, whereby the polarized light components of the laser beam are suppressed in other directions than the diagonal directions of the rectangular shape. In other words, the polarized light components of the laser beam are bipolarized in the diagonal directions and the other directions. Furthermore, since the side surfaces, on the beam outgoing aperture side, of the pair of trenches are parallel to either of the diagonal directions of the current passage region, of the polarized light components which are bipolarized, the polarized light component parallel to the side surfaces is augmented, whereas the polarized light component orthogonal to the side surfaces is suppressed. Therefore, the polarized light components of the laser beam are eventually specified into only one direction.

In the second surface emitting semiconductor laser device according to the another embodiment of the present invention, the current passage region is rectangular or elliptic in shape according to the shape of the resonance part, whereby the polarized light components of the laser beam are suppressed in other directions than the longitudinal direction of the current passage region. In other words, the direction of polarization of the laser beam is controlled to the longitudinal direction. Further, since the side surfaces, on the beam outgoing aperture side, of the pair of trenches are parallel to the longitudinal direction of the current passage region, the polarized light component in the longitudinal direction is augmented, whereas the polarized light component orthogonal to the longitudinal direction is suppressed. Therefore, the direction of polarization of the laser beam controlled to the longitudinal direction is specified to this direction more accurately.

In the surface emitting semiconductor laser devices according to the embodiments of the present invention, the current passage region is so shaped as to have an in-plane anisotropy so as to specify the direction of polarization of the laser beam to a certain extent, and the pair of trenches are provided at predetermined positions, so that the direction of polarization of the laser beam made to go out can be accurately controlled to a fixed direction. In addition, since there is no need to use a special substrate and there is no need for a complicated shape or configuration, the devices can be manufactured easily and inexpensively. Furthermore, since there is no need to reduce the resonator in shape, it is possible to lower the resistance of the resonator and to obtain an enhanced laser beam output, and it is possible to obtain a practical surface emitting semiconductor laser device.

The objects, features and effects other than the above-mentioned of the present invention will become apparent from the following description.

DETAILED DESCRIPTION OF THE PREFERRED EMBODIMENTS

Figure 1:
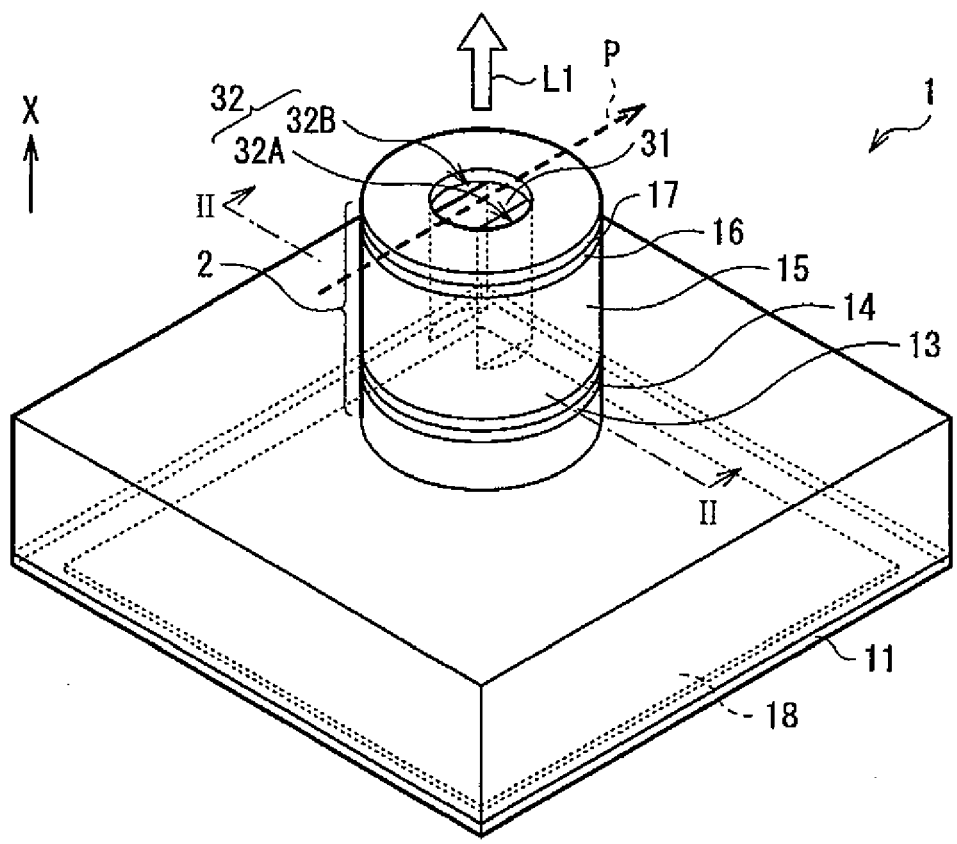
FIG. 1 is a perspective view showing the configuration of a surface emitting semiconductor laser device according to a first embodiment of the present invention.

Now, some embodiments of the present invention will be described in detail below, referring to the drawings.

First Embodiment

Figure 2:
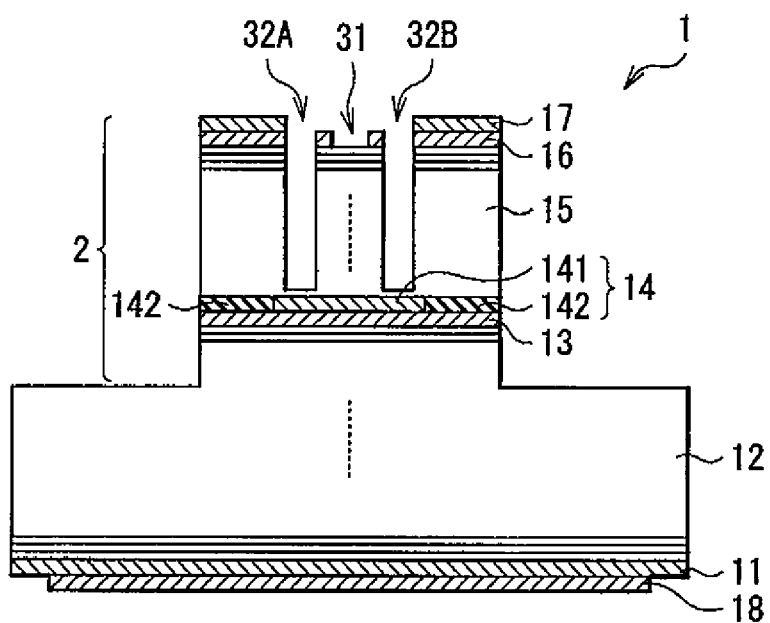
FIG. 2 is a sectional view taken along line II-II of FIG. 1.

FIG. 1 is a perspective view showing the configuration of a surface emitting semiconductor laser device according to a first embodiment of the present invention, and FIG. 2 is a sectional view taken along line II-II of FIG. 1. The surface emitting semiconductor laser device 1 has a stack structure including a first DBR layer 12, an active layer 13, a current confinement layer 14, a second DBR layer 15 and a contact layer 16 which are sequentially layered on the face side of a substrate 11. In addition, a first electrode 17 and a second electrode 18 are formed respectively on the face side of the contact layer 16 and on the back side of the substrate 11. Of these layers, an upper part of the first DBR layer 12, the active layer 13, the current confinement layer 14, the second DBR layer 15, the contact layer 16 and the first electrode 17 are altogether formed in a solid cylindrical shape, to constitute a resonance part 2 extending in the vertical direction. Besides, as shown in FIG. 2, a part of the second DBR layer 15 is exposed on the first electrode 17 side, to constitute a beam outgoing aperture 31, through which a laser beam L1 outgoes in the vertical direction.

Here, the first DBR layer 12 and the second DBR layer 15 correspond respectively to specific examples of "a first semiconductor multilayer reflective film" and "a second semiconductor multilayer reflective film" in the present invention.

The substrate 11 includes, for example, a p-type or n-type semiconductor material. The substrate 11 is preferably a (100) plane substrate, for example. Since a (100) plane substrate is a standard type substrate, so that by using this substrate it is possible to manufacture the device inexpensively. In this case, as shown in FIG. 1, the upper side of the surface emitting semiconductor laser device 1 is the x-axis direction. The following description will be made of the case where the substrate 11 is a (100) plane substrate. Incidentally, the substrate 11 may be formed, for example, from such a material as gallium nitride (GaN) and sapphire ($\alpha$ —Al$_2$O$_3$)

The active layer 13 includes a non-doped semiconductor material, and functions as an emission region for emitting light in response to a current supplied. In addition, the first DBR layer 12 and the second DBR layer 15 each include a p-type or n-type semiconductor multilayer film, and each function to reflect the light emitted from the active layer 13. Examples of the semiconductor material or materials constituting the active layer 13, the first DBR layer 12 and the second DBR layer 15 include aluminum (Al)-gallium (Ga)-arsenic (As) based materials, indium (In)—Ga—As-phosphorus (P) based materials, Ga—In—P based materials, In—P based materials, Ga-nitrogen (N) based materials, Ga—In—N based materials, and Ga—In—N—As based materials.

The current confinement layer 14 is a layer for restricting (confining) the emission region in the active layer 13, and includes a conductive current passage region 141 and an insulating current confinement region 142. The current confinement layer 14 includes an Al$_{1-x}$Ga$_x$As (0 <x<0.05) mixed crystal, and the current confinement region 142 thereof is formed by applying an oxidizing treatment to the current confinement layer 14 (includes Al$_2$O$_3$). As will be described in detail later, the oxidizing treatment forms the current passage region 141 in a rectangular shape with an in-plane anisotropy, whereby the polarized state of the laser beam L1 is varied, and an in-plane anisotropy is provided.

The contact layer 16 is a layer for electrical connection between the second DBR layer 15 and the first electrode 17, and includes gallium-arsenic (GaAs) or aluminum-gallium-arsenic (AlGaAs). Depending on the material constituting the second DBR layer 15, the contact layer 16 may include gallium-indium-phosphorus (GaInP) or gallium nitride (GaN). In addition, the first electrode 17 and the second electrode 18 are for supplying the active layer 13 with a current, and each includes titanium (Ti), nickel (Ni), gold (Au), gold-germanium (AuGe) or platinum (Pt). Depending on the configuration of the DBR layers, the contact layer 16 . . . Incidentally, the contact layer 16 and the first electrode 17 are partly stripped, to form the above-mentioned beam outgoing aperture 31.

Figure 3:
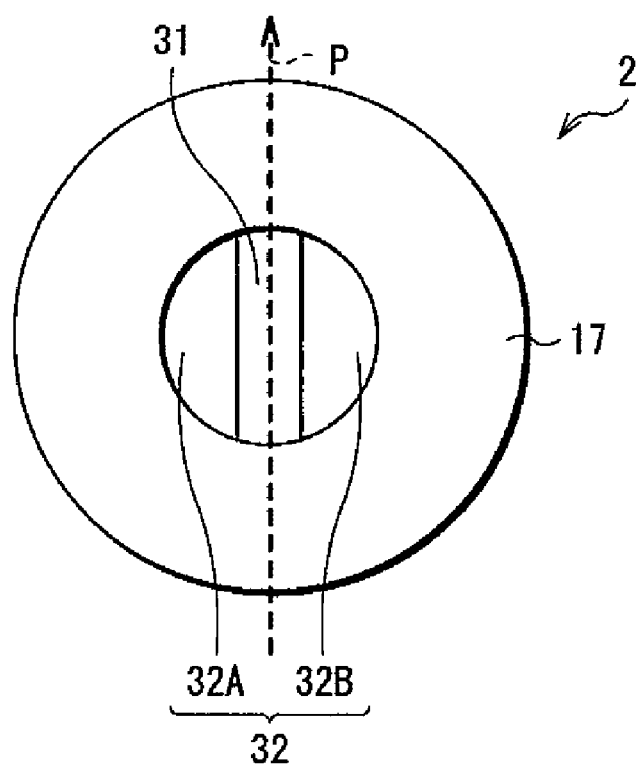
FIG. 3 is a top plan view illustrating a layout example of a light outgoing aperture and trenches.

Here, as shown in FIGS. 1 and 2, a pair of trenches 32A and 32B are formed at parts of the second DBR layer 15, the contact layer 16 and the first electrode 17 in the resonance part 2, specifically, at opposite positions with the beam outgoing aperture 31 as a center therebetween. FIG. 3 is a top plan view of the resonator 2, wherein arrow P indicates either of the diagonal directions of the current passage region 141 formed in the rectangular shape as above-mentioned (the [011] direction or the [01 –1] direction). Thus, the trenches 32A and 32B have their side surfaces, on the beam outgoing aperture 31 side, being parallel to either of the diagonal directions of the current passage region 141, whereby the polarized state of the laser beam L1 can be further varied and the laser beam L1 can be specified to be a polarized light component in one direction (the [011] direction or the [01 –1] direction).

Now, referring to FIGS. 4 to 7, the configuration of the trenches 32A, 32B and the current passage region 141 will be described below.

Figure 4:
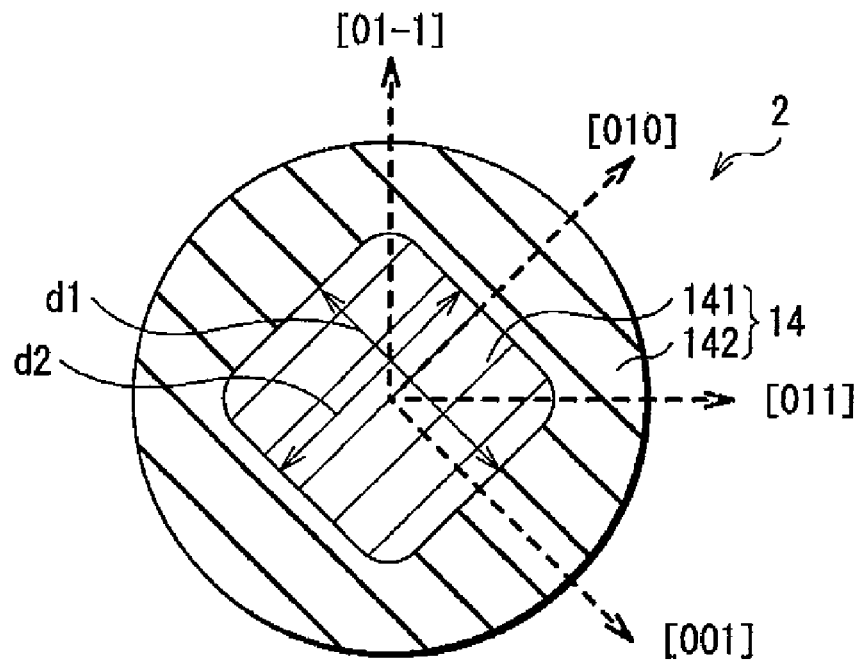
FIG. 4 is a sectional view illustrating the structure of a current passage region in a current confinement layer.

FIG. 4 is a sectional view showing the configuration of the current passage region 141 in the current confinement layer 14.

Figure 5:
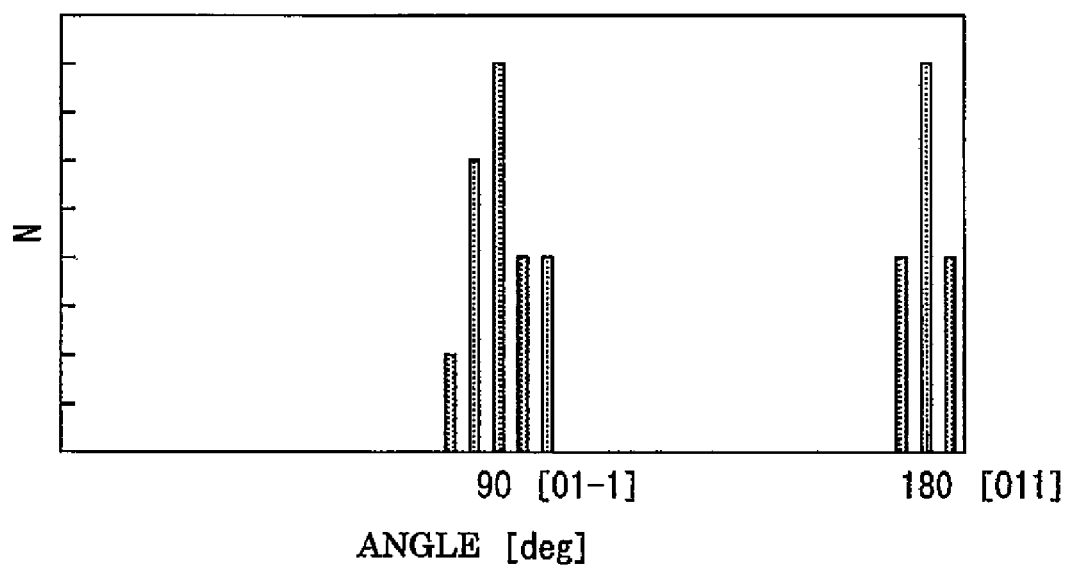
FIG. 5 is a characteristic diagram representing the polarized state of a laser beam by the current confinement layer shown in FIG. 4.

Thus, the circular current confinement layer 14 is provided with the current confinement region 142 oxidized from the peripheral area by the oxidizing treatment, with the result that the rectangular current passage region 141 is formed in a central area thereof. In addition, the current passage region 141 has its diagonal directions set in the [011] direction and the [01 –1] direction, as above-mentioned. This is because the oxidation rate in the current confinement layer 14 in the [011] direction and the [01 –1] direction is different from that in the [010] direction and the [001] direction which are at an angle of 45° to the former directions, specifically, the oxidation rate in the former directions is lower than that in the latter directions. Therefore, by forming the current passage region 141 having the in-plane anisotropy as shown in FIG. 4, it is possible to vary the polarized state of the laser beam L1 as shown in FIG. 5 and thereby to bipolarize the polarized light components into the [011] direction and the [01 –1] direction. The length of the current passage region 141 in the [011] direction and the [01 −1] direction is different from that in the [010] direction and the [001] direction, specifically, the length d1 in the former directions is greater than the length d2 in the latter directions, so that a difference in the light gain effect is generated therebetween. Incidentally, in FIG. 5, the axis of abscissas represents the angle (deg) that the direction of a peak of emission intensity forms against the [0 −1 −1] direction, and the axis of ordinates represents the number of samples evaluated which provide the peak of emission intensity.

It is to be noted here that the polarization ratio in the laser beam L1 is about 20 to 30%, which is weak as a polarized state, and the polarization direction is instable. In view of this, in the surface emitting semiconductor laser device 1 according to the present embodiment, the trenches 32A and 32B having their side surfaces, on the beam outgoing aperture 31 side, set in parallel to either of the diagonal directions of the current passage region 141 are provided at opposite positions with the beam outgoing aperture 31 as a center therebetween, as above-mentioned.

Figure 6A:
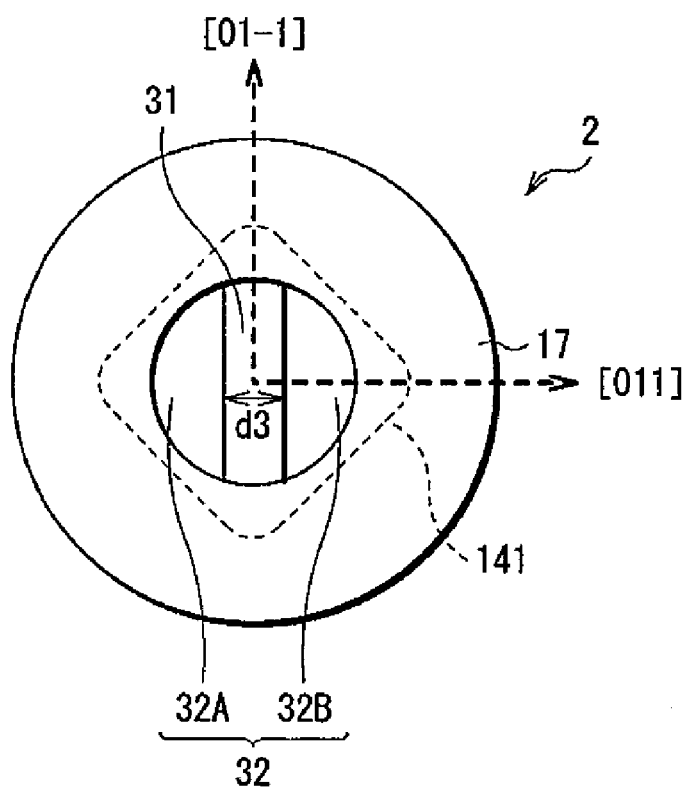
FIGS. 6A and 6B are top plan views illustrating layout examples of the light outgoing aperture, the trenches and the current confinement region.
Figure 6B:
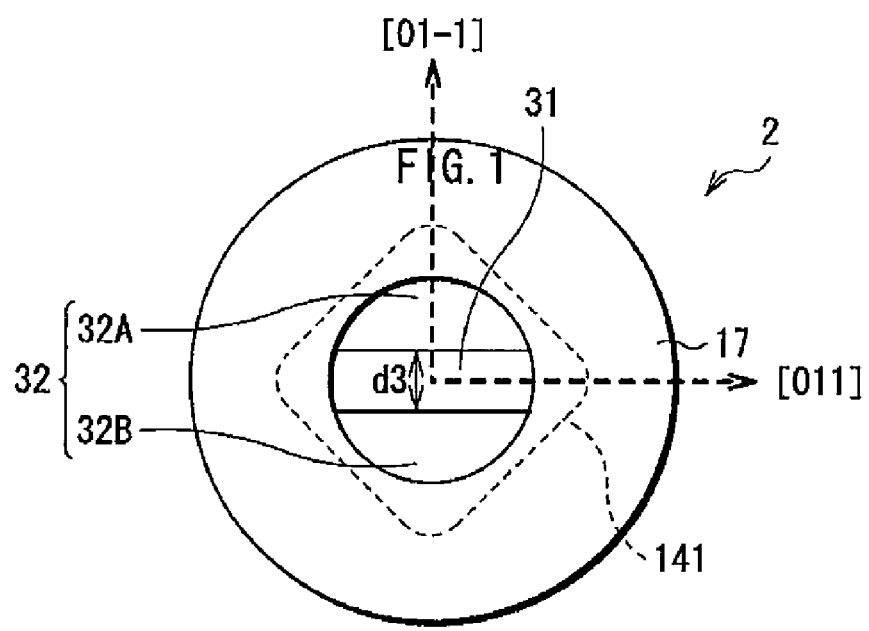
Figure 7:
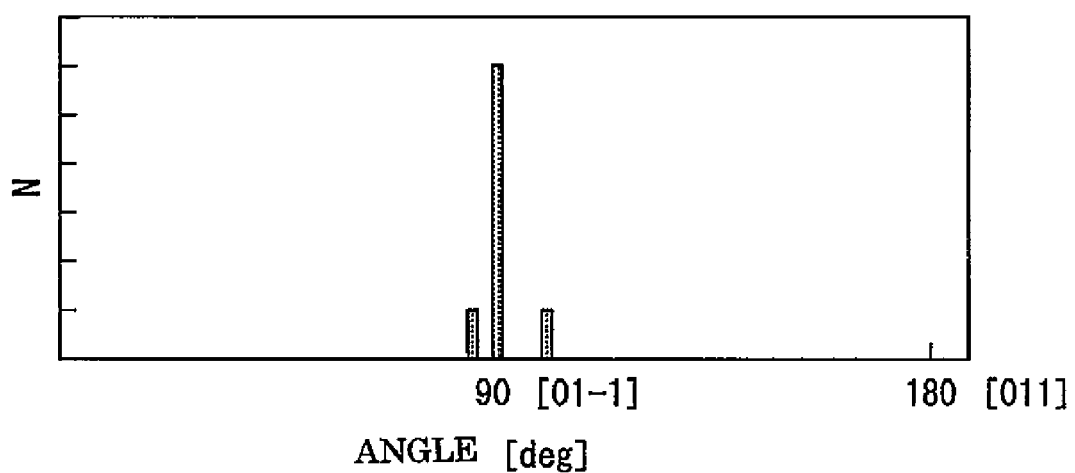
FIG. 7 is a characteristic diagram representing the polarized state of a laser beam in the cases where the trenches shown in FIGS. 6A and 6B are provided.

FIGS. 6A and 6B are top plan views showing layout examples of the beam outgoing aperture 31, the trenches 32A, 32B and the current passage region 141, wherein FIG. 6A shows the case where the above-mentioned side surfaces are parallel to the [01 −1] direction, and FIG. 6B shows the case where the side surfaces are parallel to the [011] direction. Where the trenches 32A and 32B are formed in this manner, their side surfaces on the beam outgoing aperture 31 side exert a loss effect on the beams in the direction orthogonal to the side surfaces. As a result, of the polarized light components bipolarized into the diagonal directions of the current passage region 141, the polarized light component parallel to the side surfaces is augmented, while the polarized component orthogonal to the side surfaces is suppressed. Specifically, in the case of the configuration shown in FIG. 6A, the polarized light component in the [01 −1] direction is augmented, while the polarized light component in the [011] direction is suppressed. On the other hand, in the case of the configuration shown in FIG. 6B, the polarized light component in the [011] direction is augmented, whereas the polarized light component in the [01 −1] direction is suppressed. Therefore, for example in the case of the configuration of FIG. 6A, it is possible to further vary the polarized state of the laser beam L1 as shown in FIG. 7, thereby to specify the beam to be the polarized light component in one direction (the [01 −1] direction) and to enhance the polarization ratio to a value of not less than 10 dB.

Incidentally, the spacing d3 between these trenches 32A and 32B is preferably 3 to 10 μm. If the spacing is below this range, the output of the laser beam L1 outgoing would be lowered (to or below about 0.01 W); if the spacing is above this range, the light loss effect would not be produced sufficiently, so that it may be impossible to control the polarized state of the laser beam L1.

Figure 8A:
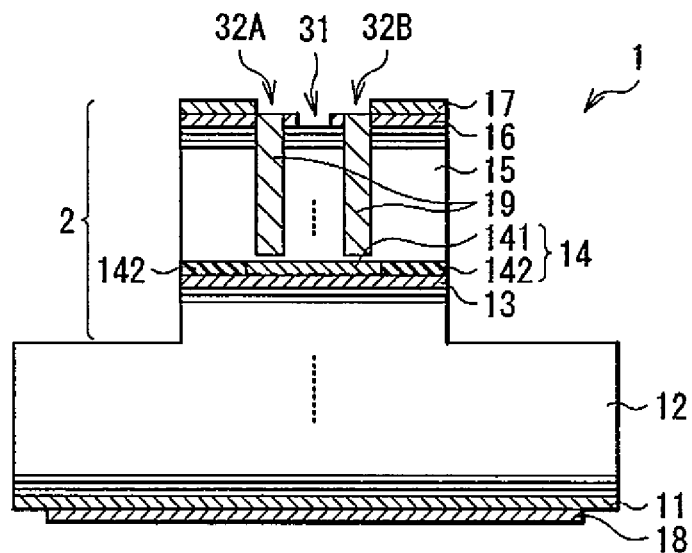
FIGS. 8A, 8B and 8C are sectional views showing other configuration examples of the surface emitting semiconductor laser device.
Figure 8B:
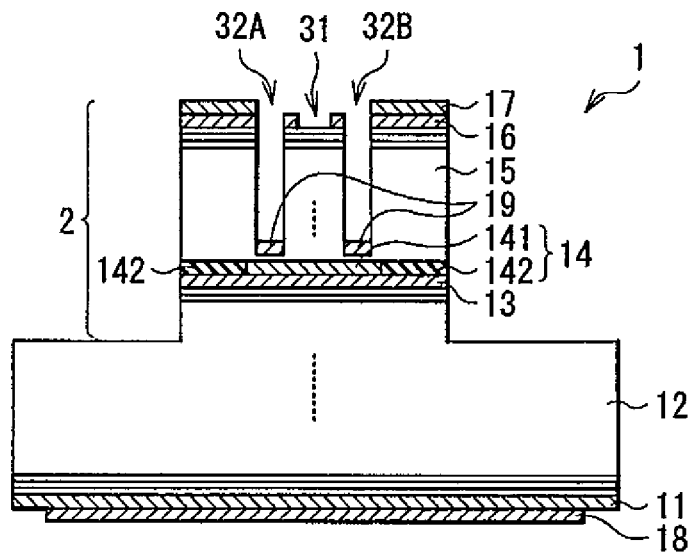
Figure 8C:
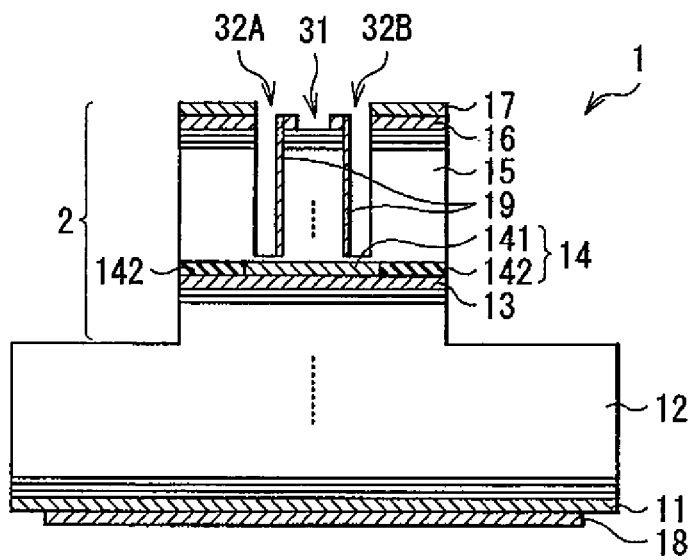

In the light emitting apparatus 1 in the present embodiment, the trenches 32A and 32B may be filled with a metallic material or insulating material 19, as shown for example in FIGS. 8A to 8C. In this case, the trenches 32A and 32B may be entirely filled up with the metallic material or insulating material 19 as shown in FIG. 8A, or the trenches 32A and 32B may be partly filled with the metallic material or insulating material 19 as shown in FIGS. 8B and 8C (partly in the vertical direction, or partly in the horizontal direction, respectively). In addition, either one of the trenches 32A and 32B may only be filled with the metallic or insulating material 19. Examples of the metallic material which can be used include gold (Au), platinum (Pt), nickel (Ni), gold-germanium (AuGe), gold-zinc (AuZn), chromium-gold (CrAu), titanium (Ti), and aluminum (Al). Examples of the insulating material which can be used include polyimides, silicon oxide ($SiO_x$) and silicon nitride ($SiN_x$). Each of these metallic materials and insulating materials is preferably a material which absorbs the laser light L1 emitted. Those materials other than the above-mentioned materials which have an absorptive effect on the laser beam L1 can also be used, to promise the same or similar effect. Due to the phenomenon in which the polarized light component in the direction orthogonal to the side surfaces, on the beam outgoing aperture 31 side, of the trenches 32A and 32B is absorbed, the polarized light component in this direction is further suppressed, whereby the polarization ratio of the laser beam L1 can be enhanced further. Incidentally, in the case of partly filling the trenches 32A and 32B with the metallic material or insulating material 19, it is preferable for filling the trenches 32A and 32B with the material on the bottom side or on the inner sides thereof, as respectively shown in FIGS. 8B and 8C, in consideration of the light loss effect. For example, in the case of filling the trenches with the material on the bottom side thereof, a polarization ratio enhancing effect can be obtained by filling with the material in a thickness of not less than about 0.5 μm.

Besides, the trenches 32A and 32B may be filled with a metallic material (for example gold-zinc (AuZn)) permitting easy obtainment of ohmic contact with the first electrode 17 includes a metallic material, so as to achieve electrical contact with the first electrode 17, as shown in FIG. 8A. In the case of such a configuration, a current injected from the first electrode 17 is injected into the active layer 13 not through the second DBR layer 15 but through the trenches filled with the metallic material, whereby the resistance in the resonator 2 can be further reduced.

Furthermore, in the case where the trenches 32A and 32B are wholly filled up with the metallic material or insulating material 19 as shown in FIG. 8A, it is possible to suppress of leakage of the polarized light component orthogonal to the side surfaces, on the beam outgoing aperture 31 side, of the trenches, whereby radiation of light can be prevented.

Now, an example of the method of manufacturing the surface emitting semiconductor laser device 1 configured as above will be described below, referring to FIGS. 9A to 9C and FIGS. 10A to 10C.

Figure 9A:
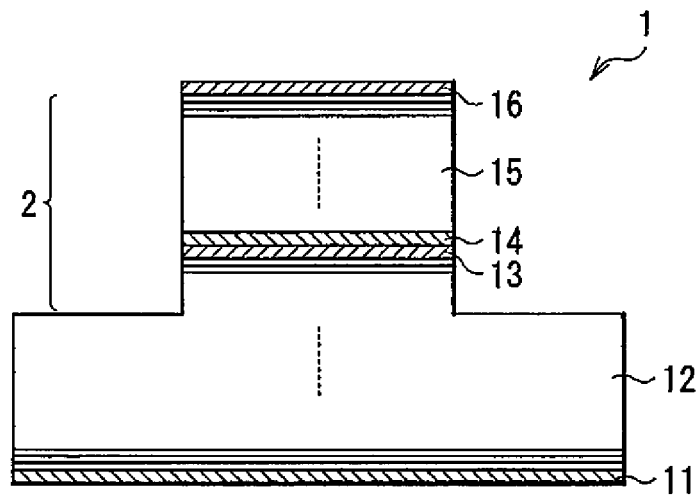
FIGS. 9A, 9B and 9C are step views for illustrating a method of manufacturing the surface emitting semiconductor laser device.

First, as shown in FIG. 9A, a first DBR layer 12, an active layer 13, a current confinement layer 14, a second DBR layer 15 and a contact layer 16 are sequentially epitaxially grown on the face side of a substrate 11 having the material and the plane orientation as above-mentioned by, for example, a metal organic chemical vapor deposition (MOCVD) process. Then, the stack structure includes these layers is processed from the contact layer 16 side by reactive ion etching (RIE) or focused ion beam etching (FIB), to form a solid cylindrical resonator 2.

Figure 9B:
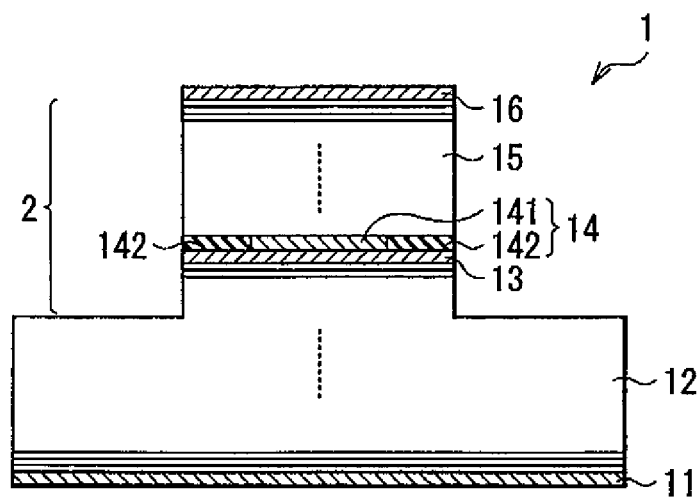

Subsequently, as shown in FIG. 9B, an oxidizing treatment is applied to the current confinement layer 14, for example, at 350 to 500° C. for several to several tens of minutes, to oxidize a peripheral portion of the current confinement layer 14, whereby a current confinement region 142 structured as above-mentioned is formed. As a result, a current passage region 141 is formed in a rectangular shape with an in-plane anisotropy, as above-mentioned. Incidentally, by varying the conditions (for example, temperature and time) of the oxidizing treatment and the thickness of the current confinement layer 14, it is possible to set the current passage region 141 to an arbitrary size.

Figure 9C:
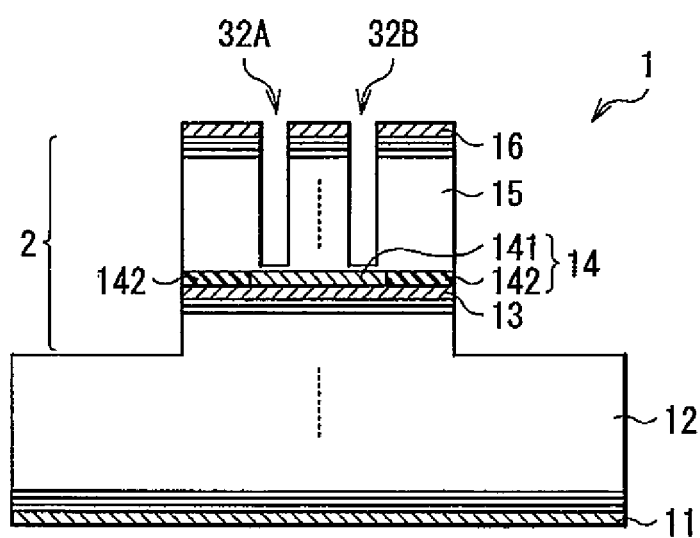

Following to the above, as shown in FIG. 9C, the stack structure is processed from the contact layer 16 side by RIE, FIB or the like, to form trenches 32A and 32B shaped as above-mentioned. In this case, it is ensured that the trenches 32A and 32B do not reach the current confinement layer 14 or the active layer 13. If the trenches 32A, 32B should reach the layer 14 or 13, the in-plane anisotropy of the current passage layer 141 would be lost or the active layer 13 would be damaged, leading to a lowering in the reliability of the device. Incidentally, the formation of the trenches 32A and 32B may be carried out prior to the formation of the solid cylindrical resonator 2 in FIG. 9A.

Figure 10A:
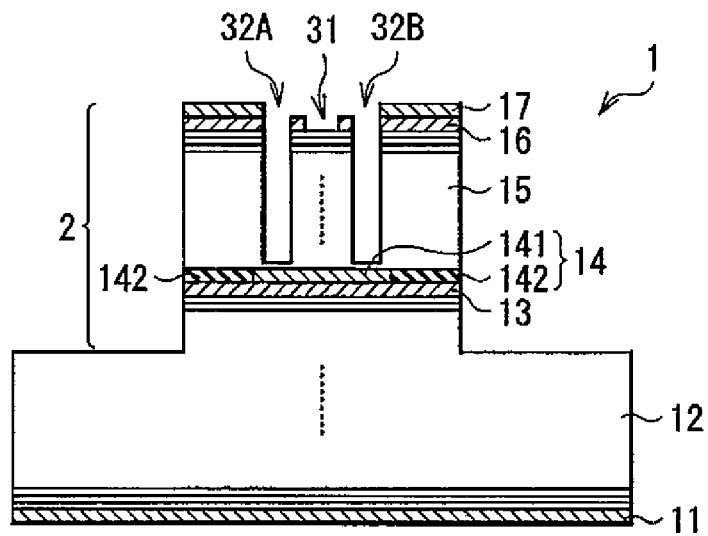
FIGS. 10A, 10B and 10C are step views of steps subsequent those of FIGS. 9A, 9B and 9C.

Subsequently, as shown in FIG. 10A, the contact layer 16 is processed by RIE, FIB or the like, to form a beam outgoing aperture 31. Then, a first electrode 17 includes the above-mentioned material is formed on the surface of the contact layer 16 by, for example, vapor deposition.

Figure 10B:
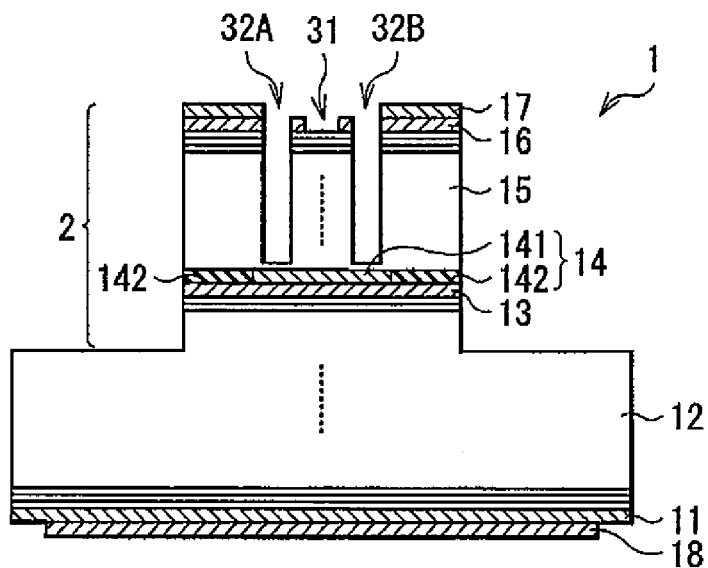

Finally, as shown in FIG. 10B, a second electrode 18 includes the above-mentioned material is formed on the back side of the substrate 11 by, for example, vapor deposition, whereby a surface emitting semiconductor laser device 1 as shown in FIG. 1 is manufactured.

Figure 10C:
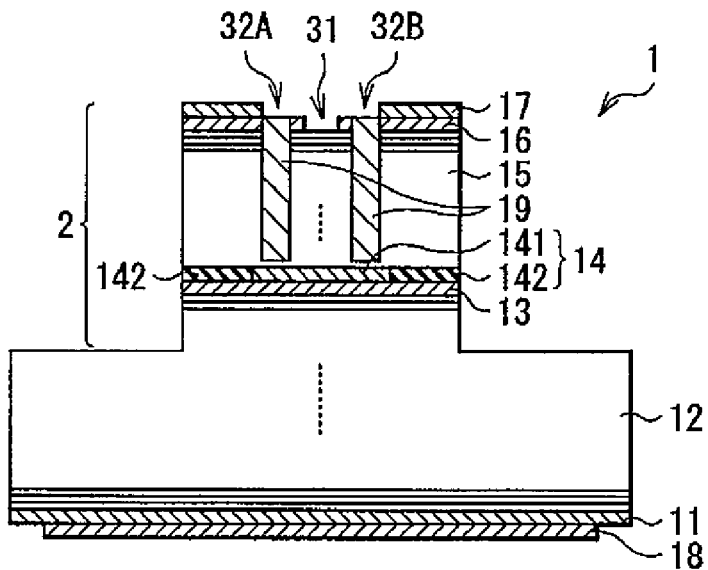
Figure 11A:
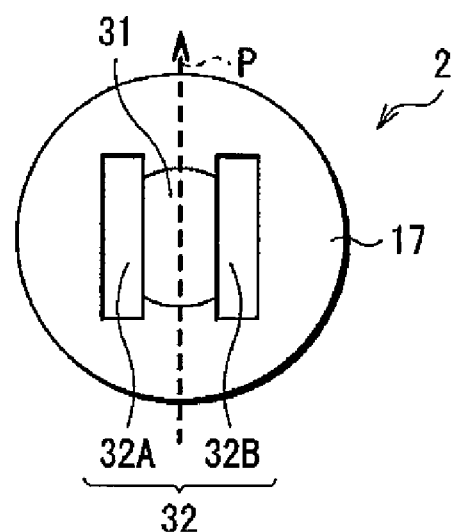
FIGS. 11A, 11B and 11C are top plan views illustrating other layout examples of the light outgoing aperture and the trenches.
Figure 11B:
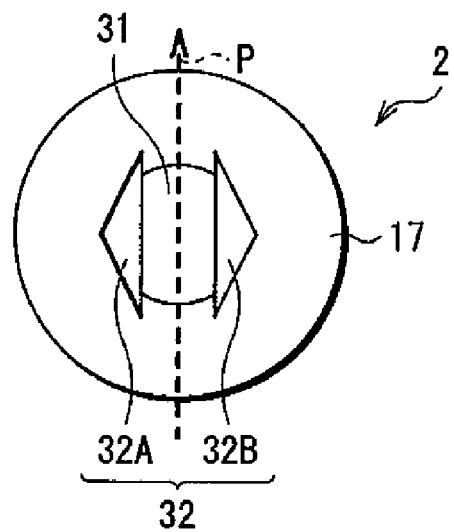
Figure 11C:
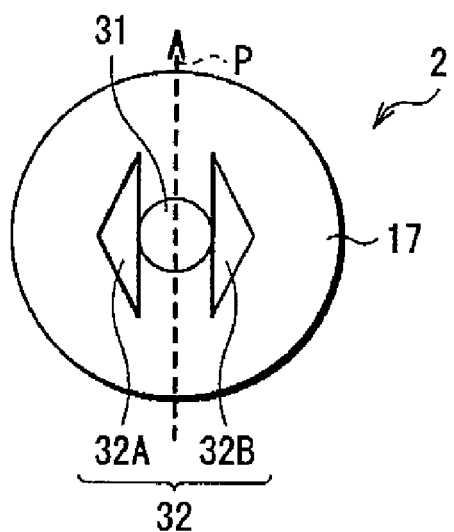

Incidentally, in the case of filling the trenches 32A and 32B with a metallic material or insulating material 19 as above-mentioned, as shown in FIG. 10C, the filling may be carried out by, for example, vapor deposition or plating. In this case, plating is preferred, in consideration of filling rate.

In this surface emitting semiconductor laser device 1, when a predetermined voltage is impressed between the first electrode 17 and the second electrode 18, a current is injected into the active layer 13 through the second DBR layer 15 and the first DBR layer 12. In this instance, the current injected from the first electrode 17 side is confined at the current confinement layer 14 so as to pass only through the current passage region 141 into the active layer 13. In the active layer 13, the thus injected current causes electron-hole recombination, resulting in light emission. The thus emitted light is reflected by the first DBR layer 12 and the second DBR layer 17, to reciprocate between the two DBR layers, whereby laser oscillation is generated, and a laser beam L1 is made to go out through the beam outgoing aperture 31 provided on the first electrode 17 side.

Here, since the current passage region 141 is formed in a rectangular shape with an in-plane anisotropy, the polarized state of the laser beam L1 is varied, and the polarized light components are bipolarized into the diagonal directions of the current passage region 141. Further, since the trenches 32A and 32B having their side surfaces, on the beam outgoing aperture 31 side, set to be parallel to either of the diagonal directions of the current passage region 141 are provided at opposite positions with the beam outgoing aperture 31 as a center therebetween, of the polarized light components thus bipolarized, the polarized light component parallel to the side surfaces is augmented, whereas the polarized light component orthogonal to the side surfaces is suppressed. Therefore, the polarized light components of the laser beam L1 are eventually specified into only one direction.

As above-mentioned, in the present embodiment, an oxidizing treatment is applied to the current confinement layer 14 to form the current passage region 141 in the rectangular shape with an in-plane anisotropy, and the pair of the trenches 32A and 32B having their side surfaces, on the beam outgoing aperture 31 side, set parallel to either of the diagonal directions of the current passage region 141 are provided at opposite positions with the beam outgoing aperture 31 as a center therebetween. Therefore, the polarized light components of the laser beam L1 made to go out through the beam outgoing aperture 31 can be specified into only one direction, and the direction of polarization can be accurately controlled to a fixed direction. Accordingly, the polarization ratio of the laser beam L1 can be enhanced.

In addition, there is no need to use a special substrate, and there is no need for a complicated shape and a complicated configuration, so that the device can be manufactured easily and inexpensively. Further, since there is no need to reduce the shape of the resonator 2, the current passage region 141 in the current confinement layer 14 can be formed with a large area, which makes it possible to lower the resistance of the resonator 2 and to enhance the output of the laser beam L1. Therefore, a practical surface emitting semiconductor laser device can be obtained.

In addition, the trenches 32A and 32B may be filled with a metallic material or insulating material 19. Especially where the filling material is a material which absorbs the laser beam L1, the polarized light component orthogonal to the side surfaces, on the beam outgoing aperture 31 side, of the trenches is absorbed by the material, whereby the polarized light component in the orthogonal direction can be suppressed, and the polarization ratio of the laser beam L1 can be further enhanced. Besides, where the trenches 32A and 32B are filled with a metallic material and the metallic material is electrically connected to the first electrode 17 includes a metallic material, a current can be injected into the active layer 13 through the trenches and, hence, the resistance of the resonator 2 can be further lowered. Further, where the trenches 32A and 32B are entirely filled up with the metallic material or insulating material 19, it is possible to restrain leakage of the polarized light component orthogonal to the side surfaces, on the beam outgoing aperture 31 side, of the trenches and to prevent radiation of light.

Incidentally, the shapes of the beam outgoing aperture 31 and the trenches 32A and 32B in the surface emitting semiconductor laser device 1 according to this embodiment are not limited to those shown in FIG. 3. As shown for example in FIGS. 11A to 11C and FIGS. 12A to 12C, the shapes may be any arbitrary shapes insofar as the side surfaces, on the beam outgoing aperture 31 side, of the trenches are parallel to either of the diagonal directions of the current passage region 141.

Figure 12A:
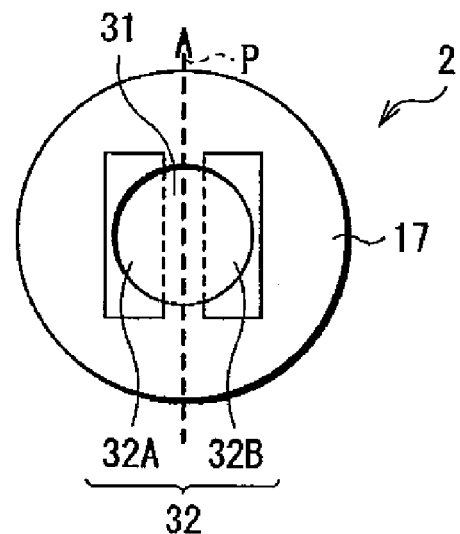
FIGS. 12A, 12B and 12C are top plan views illustrating other layout examples of the light outgoing aperture and the trenches.
Figure 12B:
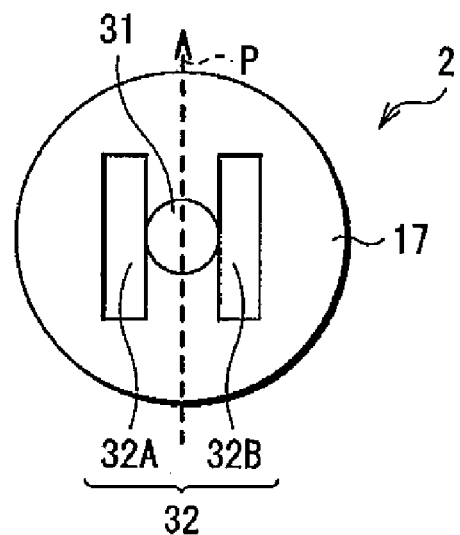
Figure 12C:
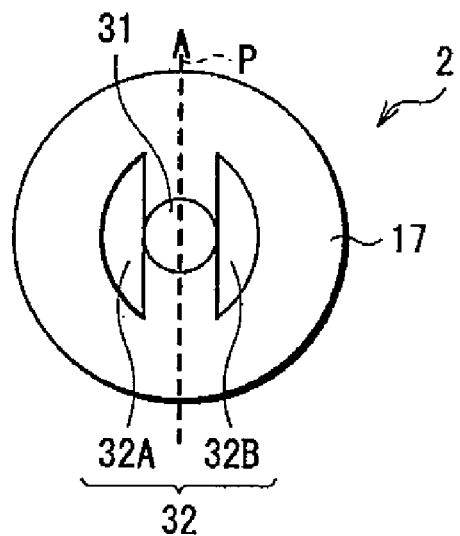

Incidentally, the shapes shown in FIG. 12A are such that in the first electrode 17 and the contact layer 16, the beam outgoing aperture 31 overlaps portions of the trenches 32A, 32B.

Figure 13:
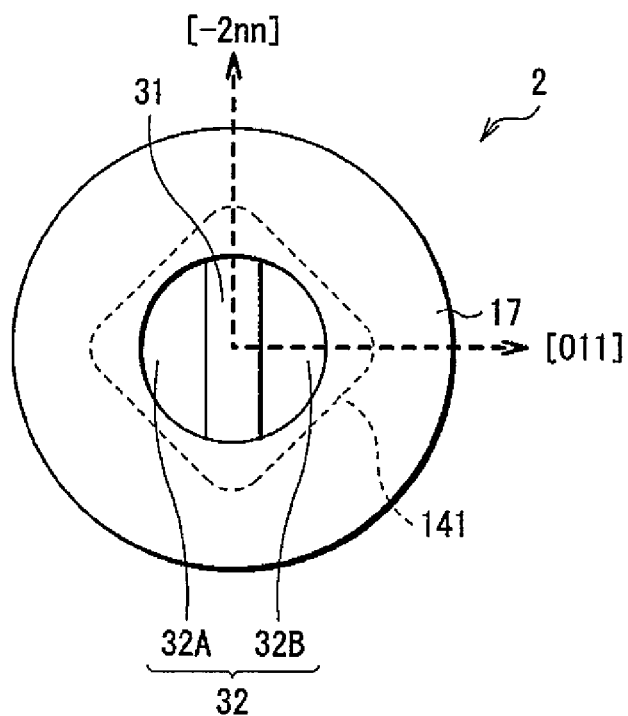
FIG. 13 is a top plan view illustrating a further layout example of the light outgoing aperture, the trenches and the current passage region.

In addition, while the case where the substrate 11 is a (100) plane substrate has been mainly described in the surface emitting semiconductor laser device 1 according to the present embodiment, a (n11) plane substrate (n: integer) inclined against the (100) plane may, for example, may be used as the substrate 11; in this case, also, the same or similar effects can be obtained. Furthermore, where the (n11) plane substrate is used in combination with the (100) plane substrate, the trenches 32A and 32B may be formed, for example, to be parallel to the [−2nn] direction as shown in FIG. 13, whereby the polarized light component in the [−2nn] direction can be further augmented.

Second Embodiment

Now, a second embodiment of the present invention will be described below.

In the first embodiment above, description has been made of the surface emitting semiconductor laser device wherein the resonator 2 has a solid cylindrical shape and the current passage region 141 is formed in the rectangular shape with an in-plane anisotropy. In the present embodiment, description will be made of a surface emitting semiconductor laser device wherein the resonator has a columnar shape being rectangular or elliptic in cross section and the current passage region has a rectangular or elliptic shape according to the shape of the resonator. Incidentally, for simplification of description, the same parts as those in the first embodiment will be described by denoting them by the same symbols as used above.

Figure 14:
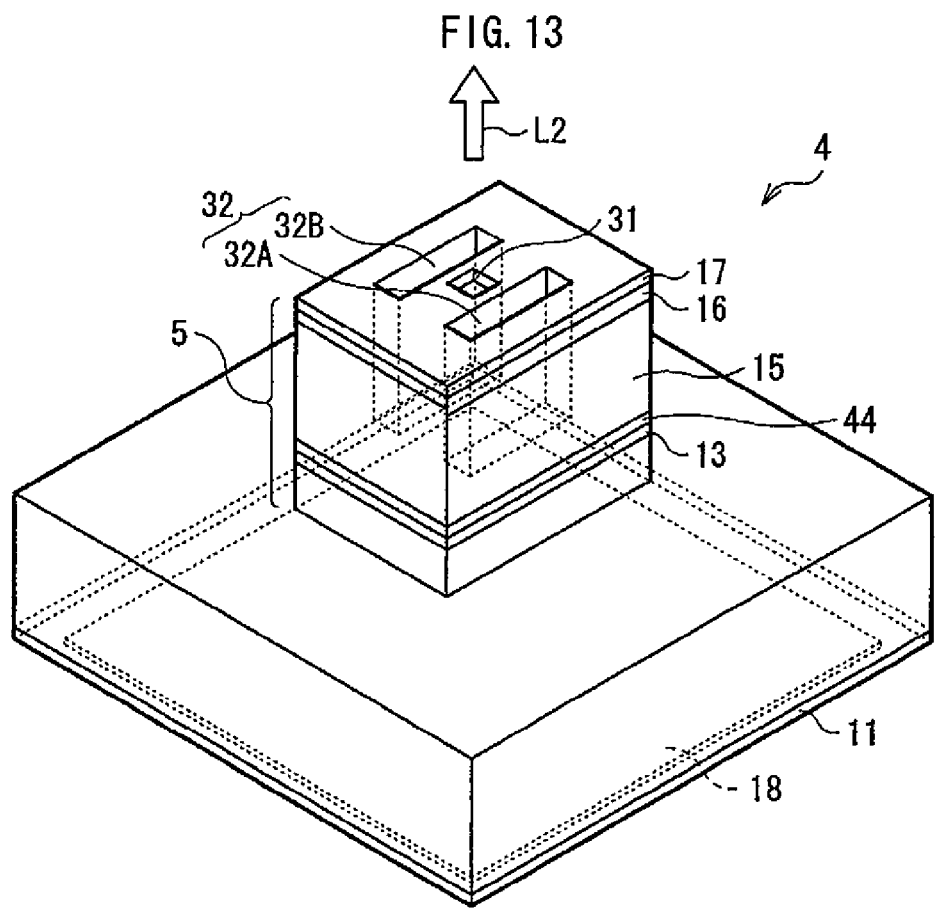
FIG. 14 is a perspective view showing the configuration of a surface emitting semiconductor laser deice according to a second embodiment of the present invention.
Figure 15:
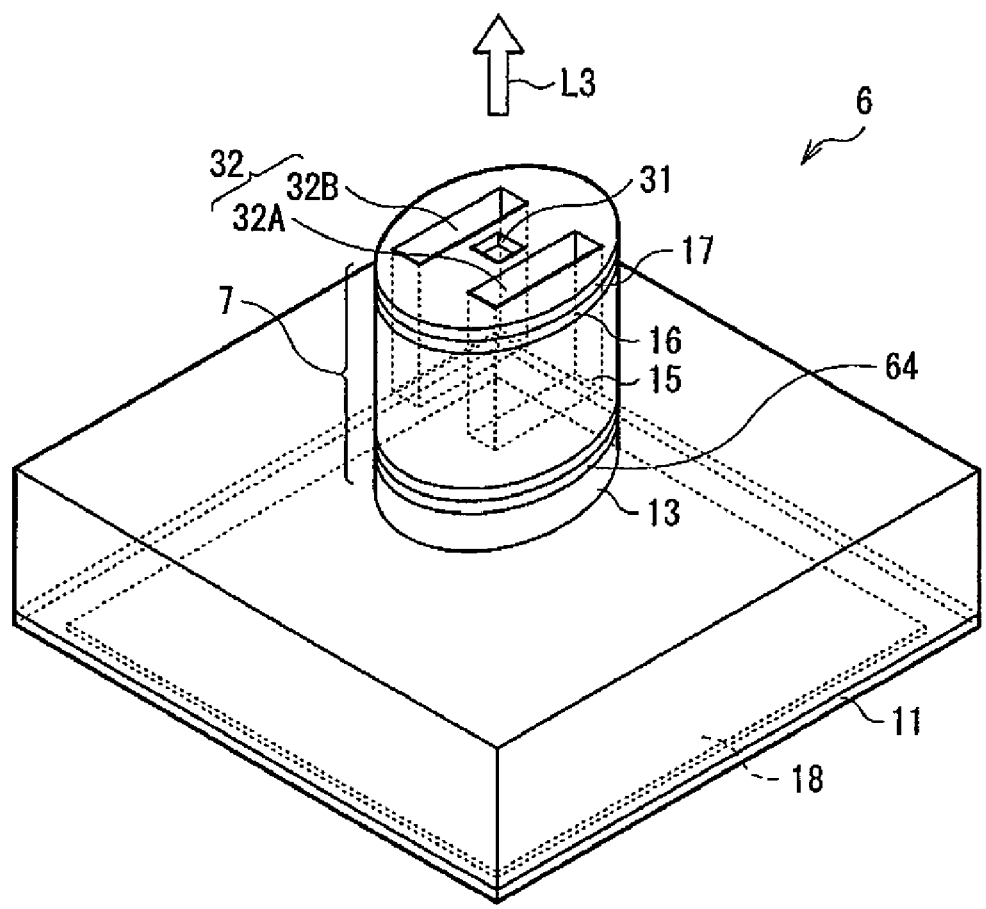
FIG. 15 is a perspective view showing a further configuration example of the surface emitting semiconductor laser device.

FIGS. 14 and 15 are perspective views showing the configurations of surface emitting semiconductor laser devices according to the present embodiment. The surface emitting semiconductor laser device 4 shown in FIG. 14 has a stack structure including a first DBR layer 12, an active layer 13, a current confinement layer 44, a second DBR layer 15 and a contact layer 16 sequentially layered on the face side of a substrate 11. On the other hand, the surface emitting semiconductor laser device 6 shown in FIG. 15 has a stack structure including a current confinement layer 64 in place of the current confinement layer 44 used in the surface emitting semiconductor laser device 4. In addition, in each of the surface emitting semiconductor laser devices 4 and 6, a first electrode 17 and a second electrode 18 are formed respectively on the surface of the contact layer 16 and on the back side of the substrate 11. Of these layers, an upper part of the first DBR layer 12, the active layer 13, the current confinement layer 14, the second DBR layer 15, the contact layer 16 and the first electrode layer 17 are altogether formed in a columnar shape being rectangular or elliptic in cross section, to constitute a resonator 5 or a resonator 7 extending in the vertical direction. In addition, in the same manner as in the first embodiment, a part of the second DBR layer 15 is exposed on the first electrode 17 side to constitute a beam outgoing aperture 31, through which a laser beam L2, L3 is made to go out in the vertical direction.

The resonators 5 and 7 respectively have a columnar shape being rectangular in cross section and a columnar shape being elliptic in cross section, as above-mentioned. In other words, unlike the solid cylindrical resonator 2 in the first embodiment, the resonators 5 and 7 are each so shaped as to have an in-plane anisotropy (to have a longitudinal direction).

Figure 16A:
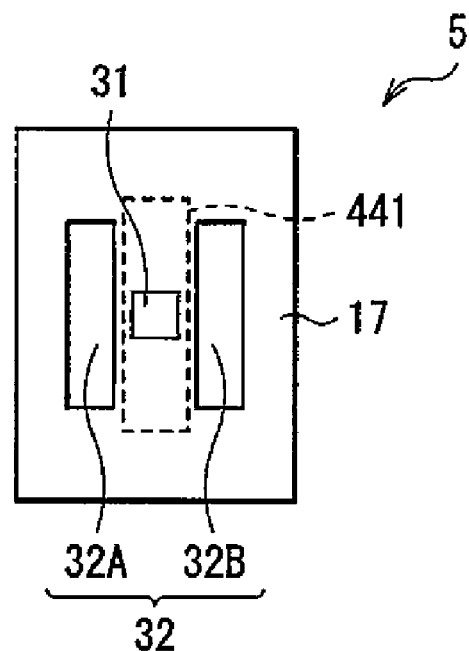
FIGS. 16A and 16B are top plan views showing layout examples of the light outgoing aperture, the trenches and the current passage region.
Figure 16B:
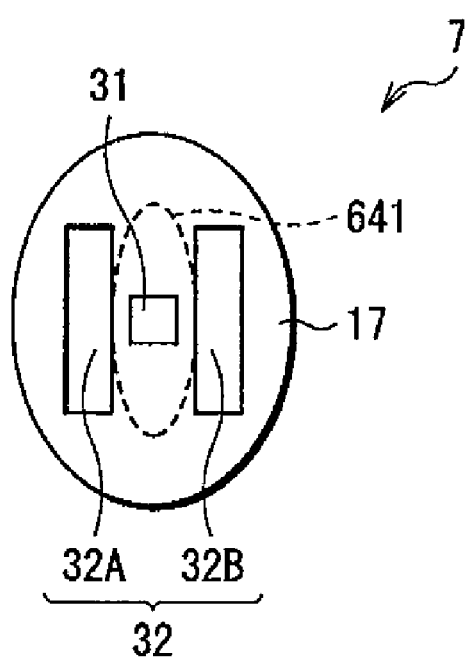
Figure 17:
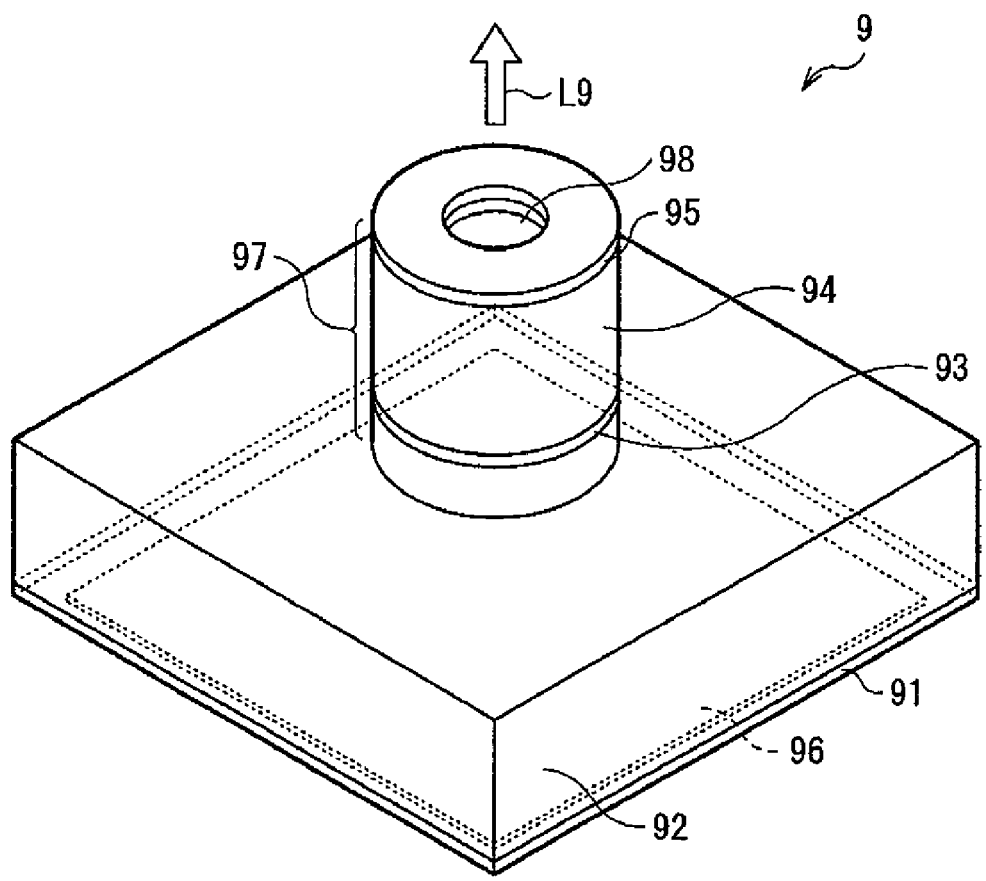
FIG. 17 is a perspective view showing the configuration of a surface emitting semiconductor laser device according to the related art.

As shown in FIGS. 16A and 16B, the current confinement layers 44, 64 have current passage regions 441, 641 which are rectangular and elliptic according to the shapes of the resonators 5, 7, respectively. The current passage regions 441, 641 are formed by applying an oxidizing treatment or an ion implanting treatment to the current confinement layers 44, 64. It should be noted here that, unlike the current passage region 141 in the first embodiment, the shapes of the current passage regions 441, 641 correspond to the shapes of the resonators 5, 7 which each have the in-plane anisotropy as above-mentioned. Therefore, in directions other than the longitudinal direction in the current passage regions 441, 641, the polarized light components of the laser beams L2, L3 are suppressed due to the light loss effect. Accordingly, the polarized light components of the laser beams L2, L3 can be controlled into the longitudinal direction.

Here, the second DBR layer 15, the contact layer 16 and the first electrode 17 in each of the resonators 5, 7 are provided with a pair of trenches 32A and 32B at parts thereof, specifically, at opposite positions with the beam outgoing aperture 31 as a center therebetween, in the same manner as in the first embodiment. It should be noted here that, unlike in the first embodiment, the trenches 32A and 32B have their side surfaces, on the beam outgoing aperture 31 side, set to be parallel to the longitudinal direction of the current passage regions 441 and 641, as shown in FIGS. 16A and 16B. Therefore, the polarized light component in the longitudinal direction is augmented, whereas the polarized light component orthogonal to the longitudinal direction is suppressed. Accordingly, the direction of polarization of the laser beams L2, L3 controlled into the longitudinal direction due to the shapes of the current passage regions 441, 641 can be more strongly specified into this direction.

Incidentally, the methods of manufacturing the surface emitting semiconductor laser devices 4, 6 in this embodiment are basically the same as the manufacturing method described in the first embodiment above, and, therefore, the description of the manufacturing methods is omitted here. Incidentally, in the case of forming the current passage regions 441, 641 by an ion implanting treatment, for example, boron ions ($B^+$) may be implanted with an energy of about 100 keV.

In the surface emitting semiconductor laser devices 4, 6, since the current passage regions 441, 641 are rectangular or elliptic in shape according to the shape of the resonance parts 5, 7, the polarized light components of the laser beams L2, L3 are suppressed in other directions than the longitudinal direction of the current passage regions 441, 641. That is, the direction of polarization of the laser beams L2, L3 is controlled into the longitudinal direction. Further, since the side surfaces, on the beam outgoing aperture 31 side, of the trenches 32A, 32B are parallel to the longitudinal direction of the current passage regions 441, 641, the polarized light component in the longitudinal direction is augmented, whereas the polarized light component orthogonal to the longitudinal direction is suppressed. Therefore, the direction of polarization of the laser beams L2, L3 controlled into the longitudinal direction can be more accurately specified into this direction.

As has been mentioned above, in the present embodiment, an oxidizing treatment or an ion implanting treatment is applied to the current confinement layers 44, 64 to form the current passage regions 441, 641 in the rectangular and elliptic shapes corresponding to the shapes of the resonators 5, 7, and the pairs of trenches 32A, 32B having their side surfaces, on the beam outgoing aperture 31 side, set in parallel to the longitudinal direction of the current passage regions 441, 641 are provided at the opposite positions with the beam outgoing aperture 31 as a center therebetween. Therefore, like in the first embodiment, the polarized light components of the laser beams L2, L3 made to go out through the beam outgoing aperture 31 can be specified into only one direction, whereby the direction of polarization can be accurately controlled into a fixed direction. Accordingly, the polarization ratio of the laser beams L2, L3 can be enhanced.

Incidentally, the surface emitting semiconductor laser devices 4, 6 in this embodiment may have the trenches 32A, 32B filled with a metallic material or insulating material 19, like in the first embodiment; in that case, also, the same effects as those in the first embodiment can be obtained.

In addition, the shapes of the beam outgoing aperture 31 and the trenches 32A, 32B in the surface emitting semiconductor laser devices 4, 6 in this embodiment are not limited to those shown in FIGS. 16A and 16B; like in the first embodiment, the shapes may be arbitrary shapes insofar as the side surfaces, on the beam outgoing aperture 31 side, of the trenches are parallel to the longitudinal direction of the current passage regions 441, 641.

While the present invention has been described by showing the first and second embodiments above, the invention is not limited to these embodiments, and various modifications are possible. For example, while an example of the case where the current confinement layer 14, 44, 64 is formed on the upper side of the active layer 13 has been described in the above embodiments, the current confinement layer may be formed on the lower side of the active layer 13. In that case, also, the same effects as those in the above embodiments can be obtained.

In addition, the material and thickness or the film forming method and film forming conditions, of each layer described in the above embodiments, are not limited, and other materials and thicknesses may be used, and other film forming methods and film forming conditions may be adopted. Furthermore, while specific configurations of the surface emitting semiconductor laser devices have been described in the above embodiments, it may be unnecessary to provide all the layers described above, and other layer(s) may be added.

It is to be understood by those skilled in the art that various modifications, combinations and alterations according to design requirements and other factors can be made within the scope of the accompanying claims or equivalents thereof.

What is claimed is:

1. A surface emitting semiconductor laser device comprising:
    a substrate;
    a first semiconductor multilayer reflective film on said substrate;
    an intermediate layer on said first semiconductor multilayer reflective film and including an active layer;
    a current passage region above said intermediate layer located in between two current confinement regions, the current passage region and the current confinement regions forming a current confinement layer;
    a second semiconductor multilayer reflective film above said current confinement layer and provided with a beam outgoing aperture, a part of said first semiconductor multilayer reflective film;
    a pair of trenches in said second semiconductor multilayer reflective film which are opposed to each other with said beam outgoing aperture as a center there between and side surfaces of which on the beam outgoing aperture side are parallel to either of the diagonal directions of said current passage region; and
    a solid cylindrical resonance part formed by said intermediate layer and said second semiconductor multilayer reflective film,
    wherein,
        said current confinement layer has a current passage region having a rectangular shape with an in-plane anisotropy.

2. The surface emitting semiconductor laser device as set forth in claim 1, wherein at least one of said pair of trenches is filled with a metallic material or insulating material.

3. The surface emitting semiconductor laser device as set forth in claim 2, wherein said metallic material is gold (Au), platinum (Pt), nickel (Ni), gold-germanium (AuGe), gold-zinc (AuZn), chromium-gold (CrAu), titanium (Ti) or aluminum (Al).

4. The surface emitting semiconductor laser device as set forth in claim 3, wherein said metallic material is placed to fill said trench or trenches by vapor deposition or plating.

5. The surface emitting semiconductor laser device as set forth in claim 2, wherein said metallic material or insulating material is a material which is absorptive with respect to a laser beam made to go out through said beam outgoing aperture.

6. The surface emitting semiconductor laser device as set forth in claim 2, wherein a metallic electrode is provided over said second semiconductor multilayer reflective film, and said trench or trenches are filled with said metallic material and electrically connected to said metallic electrode.

7. The surface emitting semiconductor laser device as set forth in claim 6, wherein a current injected into said metallic electrode is injected into said active layer through said trench or trenches.

8. The surface emitting semiconductor laser device as set forth in claim 2, wherein said insulating material is a polyimide, silicon oxide ($SiO_x$), or silicon nitride ($SiN_x$).

9. The surface emitting semiconductor laser device as set forth in claim 1, wherein the spacing between said pair of trenches is 3 to 10 μm.

10. The surface emitting semiconductor laser device as set forth in claim 1, wherein said substrate is a (100) plane substrate or a (n11) plane substrate (n: integer).

11. The surface emitting semiconductor laser device as set forth in claim 1, wherein said current passage region is formed by applying an oxidizing treatment to a current confinement layer includes a mixed crystal of aluminum (Al) and arsenic (As), and side surfaces, on the beam outgoing aperture side, of said pair of trenches are in the [01 −1] direction or the [011] direction.

12. The surface emitting semiconductor laser device as set forth in claim 1, wherein said first semiconductor multilayer reflective film, said active layer and said second semiconductor multilayer reflective film include an aluminum (Al)-gallium (Ga)-arsenic (As) based material, an indium (In)—Ga—As-phosphorus (P) based material, a Ga—In—P based material, an In—P based material, a Ga-nitrogen (N) based material, a Ga—In—N based material or a Ga—In—N—As based material.

* * * * *